United States Patent
Tanaka et al.

(10) Patent No.: US 12,235,323 B2
(45) Date of Patent: Feb. 25, 2025

(54) ESTIMATION SYSTEM, ESTIMATION METHOD, AND VEHICLE

(71) Applicant: TOYOTA JIDOSHA KABUSHIKI KAISHA, Toyota (JP)

(72) Inventors: Nobuyuki Tanaka, Toyota (JP); Kenta Onishi, Kariya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 129 days.

(21) Appl. No.: 18/159,873

(22) Filed: Jan. 26, 2023

(65) Prior Publication Data

US 2023/0324468 A1    Oct. 12, 2023

(30) Foreign Application Priority Data

Mar. 22, 2022  (JP) .................................. 2022-045261

(51) Int. Cl.
*G01R 31/3842* (2019.01)
*G01R 31/374* (2019.01)
*H02J 7/00* (2006.01)

(52) U.S. Cl.
CPC ....... *G01R 31/3842* (2019.01); *G01R 31/374* (2019.01); *H02J 7/00712* (2020.01)

(58) Field of Classification Search
None
See application file for complete search history.

(56) References Cited

U.S. PATENT DOCUMENTS

| | | | |
|---|---|---|---|
| 2012/0112754 A1* | 5/2012 | Kawai | B60L 58/16 324/427 |
| 2013/0124029 A1* | 5/2013 | Izumi | B60L 53/14 701/22 |
| 2014/0021923 A1* | 1/2014 | Uchida | H02J 7/0016 320/118 |
| 2014/0132214 A1 | 5/2014 | Katanoda | |
| 2015/0321570 A1* | 11/2015 | Cun | B60L 53/11 320/109 |
| 2020/0108730 A1 | 4/2020 | Tsurutani et al. | |
| 2020/0254899 A1 | 8/2020 | Uchida et al. | |

FOREIGN PATENT DOCUMENTS

| | | |
|---|---|---|
| JP | 2012-029455 A | 2/2012 |
| JP | 5626465 B2 | 11/2014 |
| JP | 2017-195681 A | 10/2017 |
| JP | 2020-061824 A | 4/2020 |
| WO | 2012/010955 A2 | 1/2012 |

* cited by examiner

*Primary Examiner* — Jas A Sanghera
(74) *Attorney, Agent, or Firm* — Oliff PLC

(57) ABSTRACT

An estimation system includes a power storage device and one or more processors. The one or more processors are configured to execute a charge process of controlling a charge device so as to charge the power storage device, and an estimation process of estimating a full charge capacity of the power storage device. The one or more processors are configured to execute the charge process with an upper limit state of charge of the power storage device set to a value that is more than a first upper limit state of charge when a predetermined condition is met, the first upper limit state of charge being the upper limit state of charge at the time when the predetermined condition is not met.

17 Claims, 12 Drawing Sheets

| | SOC2(> SOC1) | | | | |
|---|---|---|---|---|---|
| | SOCA | SOCB | SOCC | SOCD | ... |
| SOC1 SOCA | | PAB | PAC | PAD | ... |
| SOCB | | | PBC | PBD | ... |
| SOCC | | | | PCD | ... |
| ... | ... | ... | ... | ... | ... |

(SOCA < SOCB < SOCC < SOCD)

ESTIMATION SYSTEM, ESTIMATION METHOD, AND VEHICLE

CROSS-REFERENCE TO RELATED APPLICATION

This application claims priority to Japanese Patent Application No. 2022-045261 filed on Mar. 22, 2022, incorporated herein by reference in its entirety.

BACKGROUND

1. Technical Field

The present disclosure relates to an estimation system that estimates the full charge capacity of a power storage device, an estimation method, and a vehicle that includes the estimation system.

2. Description of Related Art

Japanese Unexamined Patent Application Publication No. 2017-195681 (JP 2017-195681 A) discloses a capacity measurement device that measures the capacity of an in-vehicle battery. The capacity measurement device calculates the full charge capacity of the battery by calculating an integrated value (amount of charge) of a charge current when the battery in an empty state is charged to a fully charged state.

SUMMARY

The full charge capacity of a power storage device can be estimated even when the power storage device is not charged from an empty state to a fully charged state. For example, there is known a method of estimating the full charge capacity by dividing the amount of charge of a power storage device by an amount of increase ($\Delta SOC$) in a state of charge (SOC) of the power storage device through charge of the power storage device. The SOC is the amount of power stored in the power storage device with respect to the fully charged state, represented as 0% to 100%. When this method is used, the precision in estimating the full charge capacity is higher as $\Delta SOC$ is larger. When $\Delta SOC$ is large, such as when the power storage device is charged to the fully charged state, for example, on the other hand, the power storage device is in a highly charged state, which tends to promote degradation of the power storage device.

The capacity of power storage devices has been increasing in recent years. When the capacity of a power storage device is increased, it is occasionally preferred not to charge the power storage device to the fully charged state, in order to suppress degradation of the power storage device. For example, occasionally, an upper limit SOC that is lower than a full charge SOC is set, and the power storage device is charged such that the SOC does not exceed the upper limit SOC. When the power storage device is not charged to the fully charged state, $\Delta SOC$ due to charge may be small in many cases compared to when the power storage device is charged to the fully charged state. As a result, the precision of the full charge capacity estimated using the above method may be lowered.

The present disclosure has been made to address the above issue, and has an object to provide an estimation system and a vehicle that can suppress degradation of a power storage device and improve the precision in estimating the full charge capacity at the same time.

A first aspect of the present disclosure provides an estimation system including a power storage device, a charge device configured to charge the power storage device, and one or more processors. The one or more processors are configured to execute a charge process of controlling the charge device so as to charge the power storage device. The charge process includes a restricted charge process in which the one or more processors control the charge device so as to charge the power storage device such that a state of charge of the power storage device does not become more than an upper limit state of charge set to be lower than a full state of charge of the power storage device. The one or more processors are configured to execute an estimation process of estimating a full charge capacity of the power storage device. The estimation process includes a process of estimating the full charge capacity by dividing an amount of charge by which the power storage device is charged through the charge process by $\Delta SOC$ that indicates an amount of increase in a state of charge (SOC) through the charge process. The one or more processors are configured to execute the restricted charge process when a predetermined condition is not met. On the other hand, the one or more processors are configured to execute, when the predetermined condition is met, the restricted charge process with the upper limit state of charge of the power storage device set to a second upper limit state of charge that is more than a first upper limit state of charge that is the upper limit state of charge at a time when the condition is not met.

With such a configuration, when the predetermined condition is not met, the restricted charge process is executed, and therefore the power storage device is not charged to the fully charged state. As a result, degradation of the power storage device is suppressed. When the predetermined condition is met, on the other hand, the charge process is executed with the upper limit SOC raised. Consequently, $\Delta SOC$ is increased compared to when the condition is not met. As a result, an error in the result of estimating the full charge capacity is reduced. Thus, it is possible to suppress degradation of the power storage device and improve the precision in estimating the full charge capacity at the same time.

In the estimation system according to the above first aspect, the one or more processors may be configured to execute, when the predetermined condition is met, the restricted charge process with the upper limit state of charge of the power storage device set to the second upper limit state of charge, and further execute the estimation process through the restricted charge process.

In the estimation system according to the above first aspect, the second upper limit state of charge may be the full state of charge of the power storage device.

In the estimation system according to the above first aspect, the one or more processors may be configured to determine that the predetermined condition is met when the upper limit state of charge is set by a user.

With such a configuration, the user is enabled to set the upper limit state of charge, and the charge process is executed with the upper limit state of charge set by the user raised. Consequently, it is possible to improve the precision in estimating the full charge capacity while improving the convenience for the user.

In the estimation system according to the above first aspect, the one or more processors may be configured to determine that the predetermined condition is met when a state in which the upper limit state of charge is set by the user has continued for a predetermined threshold time or more.

As the time for which a state in which the upper limit state of charge is set by the user has continued becomes longer, the time for which the power storage device is not fully charged becomes longer. Therefore, there is a higher possibility that the estimation process is executed with low $\Delta$SOC. As a result, the precision in estimating the full charge capacity may be lowered. With the above configuration, the restricted charge process can be executed until the state in which the upper limit state of charge is set by the user continues for the threshold time or more. When this state continues for the threshold time or more, on the other hand, the charge process is executed with the upper limit state of charge raised. As a result, the charge process can be executed with the upper limit state of charge raised at an appropriate timing.

In the estimation system according to the above first aspect, the one or more processors may be configured to determine that the predetermined condition is met when the restricted charge process is executed a predetermined threshold number of times or more consecutively.

As the number of times of consecutive execution of the restricted charge process becomes larger, the time for which the power storage device is not fully charged becomes longer. Therefore, there is a higher possibility that the estimation process is executed with low $\Delta$SOC. As a result, the precision in estimating the full charge capacity may be lowered. With the above configuration, the charge process is executed with the upper limit state of charge raised when the restricted charge process is executed the threshold number of times or more consecutively. As a result, the charge process can be executed with the upper limit state of charge raised at an appropriate timing.

In the estimation system according to the above first aspect, the one or more processors may be configured to further execute an informing process when the restricted charge process is executed with the predetermined condition determined to be met and the upper limit state of charge of the power storage device set to the second upper limit state of charge, the informing process informing that the restricted charge process is executed with the upper limit state of charge set to the second upper limit state of charge.

In the estimation system according to the above first aspect, the one or more processors may be configured to execute the restricted charge process with the upper limit state of charge of the power storage device set to the second upper limit state of charge when setting of the upper limit state of charge to the second upper limit state of charge is permitted by a user in the informing process.

With such a configuration, the user is informed that the charge process is executed with the upper limit state of charge raised. As a result, the convenience for the user can be improved.

In the estimation system according to the above first aspect, the one or more processors may be configured to further execute a reduction informing process before executing the restricted charge process with the upper limit state of charge of the power storage device set to the second upper limit state of charge when the predetermined condition is determined to be met. The reduction informing process may be a process of informing a user that the state of charge at a start of charge of the power storage device is to be rendered less than a predetermined state of charge.

With such a configuration, the user is motivated to reduce the state of charge at the start of charge of the power storage device. Consequently, $\Delta$SOC can be increased.

In the estimation system according to the above first aspect, the charge process may include a reference charge process in which the one or more processors control the charge device so as to charge the power storage device with the state of charge at an end of charge of the power storage device more than a predetermined first reference value and with the state of charge at a start of charge of the power storage device less than a predetermined second reference value that is less than the first reference value. The one or more processors may be configured to determine that the predetermined condition is met when a state in which the reference charge process is not executed has continued for a predetermined threshold continuation time or more.

It is considered that a state in which the power storage device is not sufficiently charged continues over a long period when the above state continues for the threshold continuation time or more. With the above configuration, the restricted charge process can be executed until this state continues for the threshold continuation time or more. When the above state continues for the threshold continuation time or more, on the other hand, the charge process is executed with the upper limit state of charge raised. As a result, the charge process can be executed with the upper limit state of charge raised at an appropriate timing.

In the estimation system according to the above first aspect, the predetermined threshold continuation time may be shorter as a time elapsed since a start of use of the power storage device is shorter.

The full charge capacity of the power storage device is more easily varied (lowered) as the time elapsed since the start of use of the power storage device is shorter. With the above configuration, in a period in which the full charge capacity is more easily varied, the threshold continuation time is shorter, and therefore the charge process is more easily executed with the upper limit state of charge raised. As a result, the frequency of the charge process with the upper limit state of charge raised is enhanced. Thus, the frequency at which the process of estimating the full charge capacity is appropriately executed can be enhanced.

In the estimation system according to the above first aspect, the one or more processors may be configured to determine that the predetermined condition is met when an estimation precision is equal to or less than a predetermined threshold precision. The estimation precision may be determined in accordance with the state of charge at a start of charge of the power storage device and the state of charge at an end of charge of the power storage device.

With such a configuration, the charge process is executed with the upper limit state of charge raised when the estimation precision is equal to or less than the threshold precision. Consequently, the charge process can be executed with the upper limit state of charge raised at an appropriate timing.

In the estimation system according to the above first aspect, the power storage device may be is mounted on a vehicle. The charge process may be an external charge process in which the one or more processors control the charge device so as to charge the power storage device using power from a power facility provided outside the vehicle. The amount of charge may be an amount of power by which the power storage device is charged from the power facility since a start of the external charge process until an end of the external charge process.

With such a configuration, the precision in estimating the full charge capacity can be improved when external charge is executed.

A second aspect of the present disclosure provides an estimation method including: executing a charge process of controlling a charge device so as to charge a power storage device; and executing an estimation process of estimating a full charge capacity of the power storage device. The charge process includes a restricted charge process of controlling the charge device so as to charge the power storage device such that a state of charge of the power storage device does not become more than an upper limit state of charge set to be lower than a full state of charge of the power storage device. Further, the estimation process includes a process of estimating the full charge capacity by dividing an amount of charge by which the power storage device is charged through the charge process by ΔSOC that indicates an amount of increase in the state of charge through the charge process. The estimation method includes: determining whether a predetermined condition is met; executing the restricted charge process when the predetermined condition is determined to be not met; and executing, when the predetermined condition is determined to be met, the restricted charge process with the upper limit state of charge of the power storage device set to a second upper limit state of charge that is more than a first upper limit state of charge that is the upper limit state of charge at a time when the condition is not met.

A third aspect of the present disclosure provides a vehicle including the above estimation system.

With the present disclosure, it is possible to suppress degradation of the power storage device and improve the precision in estimating the full charge capacity at the same time.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Embodiments of the present disclosure will be described in detail below with reference to the drawings. Like or corresponding portions are denoted by like signs throughout the drawings, and description thereof will not be repeated. Each of the embodiments and modifications thereof may be combined with each other as appropriate unless any contradiction occurs.

First Embodiment

Figure 1:
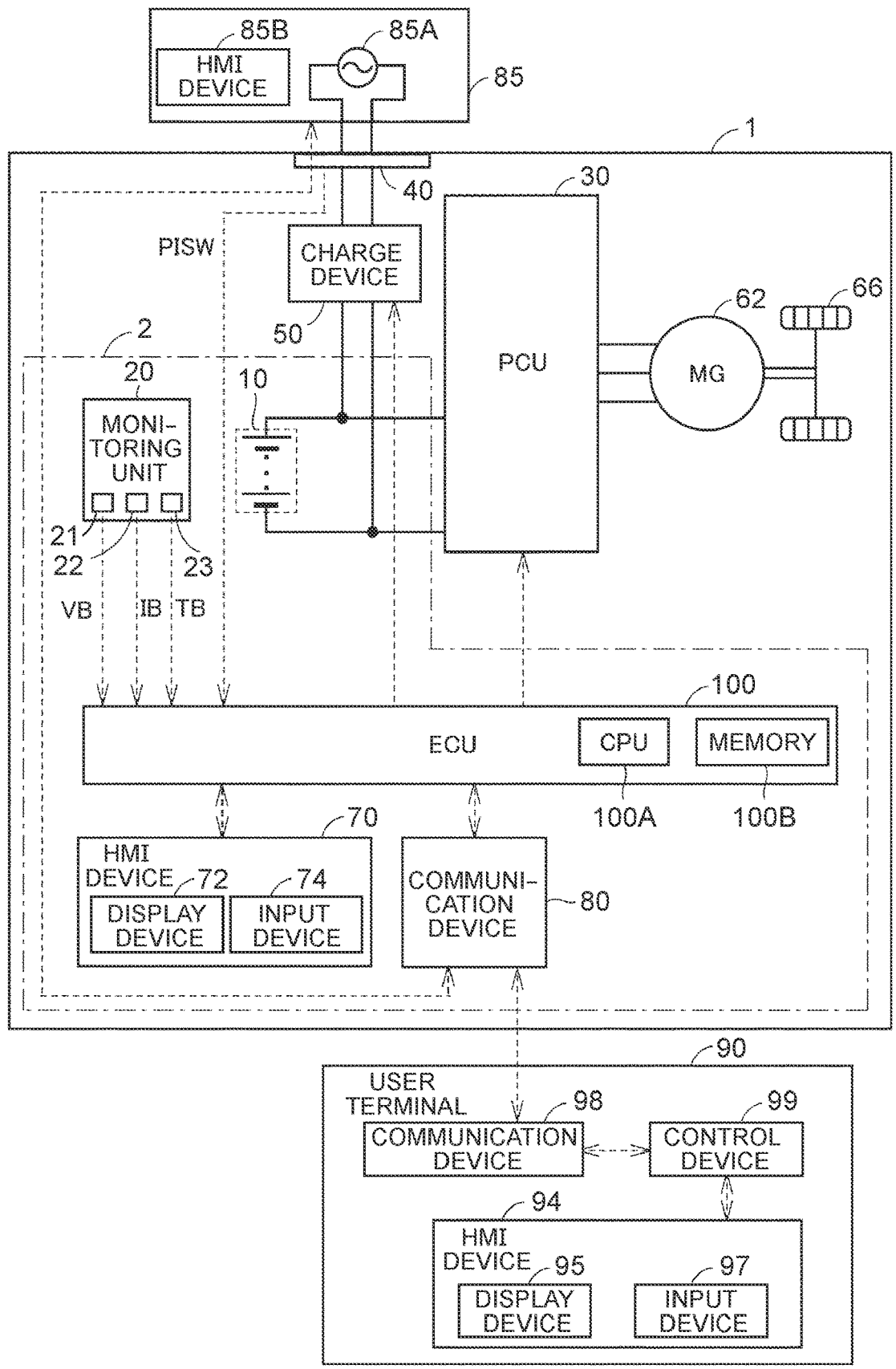
FIG. 1 is a diagram schematically showing the overall configuration of a vehicle according to a first embodiment.

FIG. 1 schematically illustrates the overall configuration of a vehicle according to a first embodiment. As illustrated in FIG. 1, a vehicle 1 is a battery electric vehicle (BEV) that includes a battery 10. The vehicle 1 is configured to be able to execute external charge in which the battery 10 is charged using power supplied from a power facility 85 (to be described later) provided outside the vehicle 1.

The vehicle 1 includes a power control unit (PCU) 30, an inlet 40, a charge device 50, a motor generator 62, drive wheels 66, and an estimation system 2.

The PCU 30 includes an inverter (not illustrated). The inverter is configured to convert direct current power supplied from the battery 10 into alternating current power and supply the converted power to the motor generator 62.

The inlet 40 is configured to receive power from the power facility 85 provided outside the vehicle 1 through a charge cable. A signal (cable connection signal PISW) that indicates whether the vehicle 1 is connected to the power facility 85 through the charge cable is transferred from the inlet 40 to an electronic control unit (ECU) 100.

The charge device 50 is configured to charge the battery 10 by converting power (alternating current power) received from the inlet 40 into direct current power that is suitable to charge the battery 10. The charge device 50 is configured to include an inverter and a converter (neither of which is illustrated), for example.

The motor generator 62 is an alternating current rotary electric machine, and is a three-phase alternating current synchronous motor in which permanent magnets are embedded in a rotor, for example. The motor generator 62 drives the drive wheels 66 using power supplied from the PCU 30. This allows the vehicle 1 to travel.

The estimation system 2 includes the battery 10, a monitoring unit 20, a human machine interface (HMI) device 70, a communication device 80, and the ECU 100.

The battery 10 is a secondary battery configured to store power for travel of the vehicle 1. The charge state of the battery 10 is represented as a state of charge (SOC). The battery 10 may be replaced with a different power storage device such as an electric double layer capacitor.

The monitoring unit 20 includes a voltage sensor 21, a current sensor 22, and a temperature sensor 23. The voltage sensor 21 detects a voltage VB of the battery 10. The current sensor 22 detects a current IB (e.g. a charge current for the battery 10) input to and output from the battery 10. The temperature sensor 23 detects a temperature TB of the battery 10.

The HMI device 70 includes a display device 72 and an input device 74. The display device 72 displays various information to a user of the vehicle 1. The input device 74 is configured to receive an input of an operation by the user of the vehicle 1. In this example, the display device 72 and the input device 74 constitute a touch screen. The HMI device 70 may further include a speaker.

The communication device 80 is configured to communicate with devices (e.g. the power facility 85 and a user terminal 90) outside the vehicle 1. The communication device 80 exchanges various information with the power facility 85 through Controller Area Network (CAN) communication, for example. The communication device 80 exchanges various information with the user terminal 90 through wireless communication, for example.

The ECU 100 includes a processor 100A and a memory 100B. The processor 100A is a central processing unit (CPU), for example. The memory 100B includes a read only memory (ROM) and a random access memory (RAM). The ROM stores a program to be executed by the processor 100A. The RAM functions as a working memory.

The ECU 100 controls various devices (e.g. the PCU 30, the charge device 50, the motor generator 62, the HMI device 70, and the communication device 80) of the vehicle 1.

The ECU 100 determines the state of connection between the vehicle 1 and the power facility 85 (i.e. whether the vehicle 1 is connected to the power facility 85) in accordance with the signal level of the cable connection signal PISW. The ECU 100 receives a signal that indicates the result of a user operation performed using the input device 74 of the HMI device 70 from the HMI device 70.

The ECU 100 is configured to execute a charge process of charging the battery 10. A case where the charge process is an external charge process will be mainly described below. The external charge process is a process in which the battery 10 is charged using power from the power facility 85. In this example, the external charge process is a process in which the ECU 100 controls the charge device 50 such that power from the power facility 85 is converted and the battery 10 is charged using the converted power.

The ECU 100 starts the external charge process when a signal indicating that an operation to instruct start of power supply from the power facility 85 to the vehicle 1 has been performed using an HMI device 85B (to be described later) is received from the power facility 85, by way of example. Then, the ECU 100 determines whether the SOC of the battery 10 has reached a threshold SOC. The threshold SOC may be a full charge SOC (100%) at the time when the battery 10 is fully charged or an upper limit SOC that is lower than the full charge SOC, for example. A method of setting the upper limit SOC will be described in detail later. When the SOC reaches the threshold SOC, the ECU 100 ends the external charge process. Specifically, the ECU 100 outputs a power supply stop request to the power facility 85 such that power supply from the power facility 85 to the vehicle 1 is ended.

When the external charge process is executed such that the SOC at the end of external charge is more than a first reference value (e.g. 80%) and the SOC at the start of external charge is less than a second reference value (e.g. 30%) that is less than the first reference value (i.e. when the external charge process is executed such that the SOC is raised from a state of being less than the second reference value to a state of being more than the first reference value), the external charge process is also referred to as a reference charge process. The time when the reference charge process is ended is referred to as a "reference time".

The ECU 100 is configured to be able to execute a restricted charge process in which the battery 10 is charged such that the SOC of the battery 10 does not exceed the upper limit SOC. The restricted charge process is executed in order to suppress degradation of the battery 10.

The ECU 100 receives detection values (voltage VB, current IB, and temperature TB) from the sensors of the monitoring unit 20. The ECU 100 calculates the SOC of the battery 10 in accordance with the above detection values.

The ECU 100 executes an "estimation process" of estimating the full charge capacity of the battery 10. The ECU 100 executes the estimation process in accordance with the detection values from the sensors of the monitoring unit 20 and a program and a map stored in the memory 100B. The ECU 100 may execute the estimation process each time the charge process is executed, or may execute the estimation process each time the charge process is executed a predetermined number of times. The estimation process will be described in detail later.

The power facility 85 includes a power source 85A and an HMI device 85B. The power source 85A is a commercial power source, for example, and is configured to supply alternating current power to the vehicle 1. The HMI device 85B is configured to receive a user operation (e.g. an operation to start or stop power supply) related to power supply from the power facility 85 to the vehicle 1. A signal that indicates the result of the user operation is transferred to the vehicle 1 through CAN communication, for example.

The user terminal 90 is a communication terminal that can be carried by the user of the vehicle 1, and is a smartphone, for example. The user terminal 90 includes a communication device 98, an HMI device 94, and a control device 99. The communication device 98 is configured to wirelessly communicate with the vehicle 1.

The HMI device 94 includes a display device 95 and an input device 97. The HMI device 94 may further include a speaker. The display device 95 displays various information to the user. The input device 97 receives an input of a user operation. The user operation is an operation to set the upper limit SOC at the end of external charge of the vehicle 1, for example. The display device 95 and the input device 97 constitute a touch screen.

The control device 99 controls various devices (e.g. the HMI device 94 and the communication device 98) of the user terminal 90. When the input device 97 receives an input of a user operation, for example, the control device 99 transmits a signal that indicates the result of the user operation to the vehicle 1 through the communication device 98.

Figure 2:
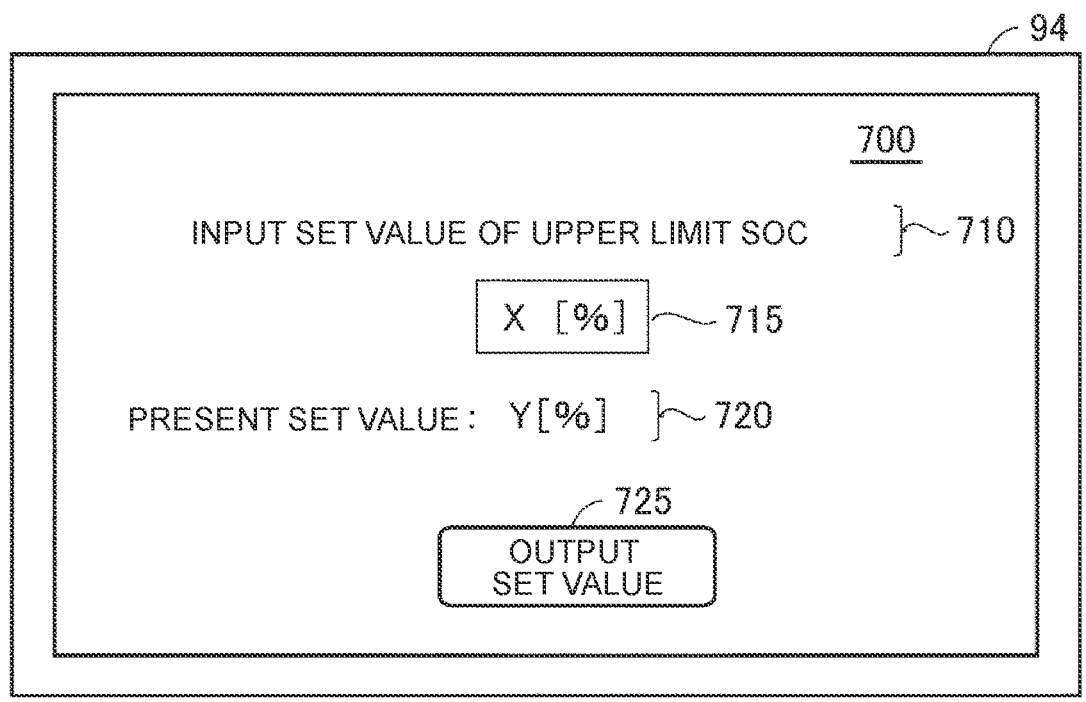
FIG. 2 is a diagram showing an example of a screen displayed on a human machine interface (HMI) device of a user terminal in order to set an upper limit SOC.

FIG. 2 illustrates an example of a screen displayed on the HMI device 94 of the user terminal 90 in order to set the upper limit SOC.

With reference to FIG. 2, a screen 700 includes a message 710, a setting input unit 715, a setting display unit 720, and a button 725.

The message 710 prompts the user to input a set value of the upper limit SOC. The setting input unit 715 receives an input of a set value (X %) of the upper limit SOC from the user. The setting display unit 720 displays the present set value (Y %) of the upper limit SOC.

The button 725 is provided to receive a user operation for outputting a set value of the upper limit SOC to the vehicle 1. When the button 725 is operated with a set value (X %)

of the upper limit SOC input to the setting input unit 715, the set value of the upper limit SOC is output from the user terminal 90 to the vehicle 1. Consequently, the set value of the upper limit SOC is overwritten (from Y % to X %).

Figure 3:
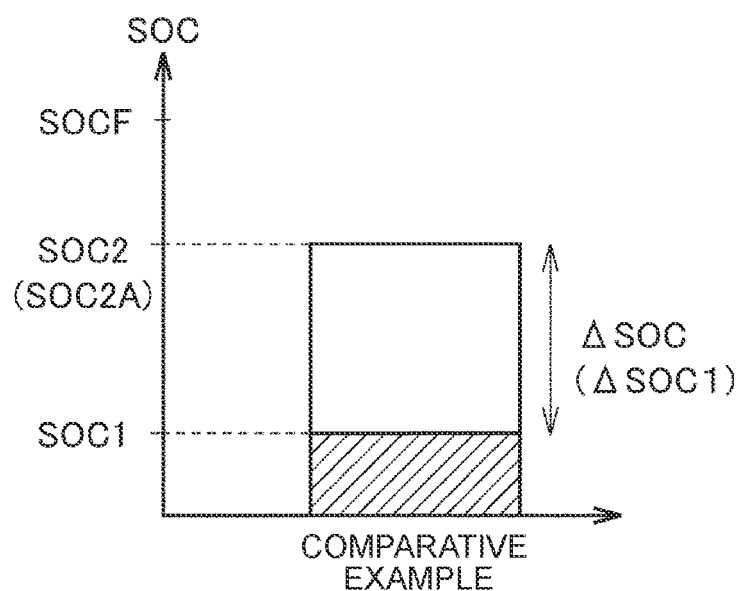
FIG. 3 is a diagram for illustrating an estimation process of estimating a full charge capacity of a battery.

FIG. 3 illustrates an estimation process of estimating the full charge capacity of the battery 10. This example is a comparative example in which the ECU 100 does not execute the process to be described later.

With reference to FIG. 3, $\Delta SOC$ is the difference between a charge start SOC (SOC1) and a charge end SOC (SOC2) for the case where the external charge process is executed ($\Delta SOC=SOC2-SOC1$). The charge start SOC is the SOC at the start of external charge. The charge end SOC is the SOC at the end of external charge. In this example, the charge end SOC is equal to the upper limit SOC set in the restricted charge process, and is SOC2A. SOCF corresponds to the full charge SOC.

The ECU estimates the full charge capacity by dividing the amount of charge ($\Delta Ah$) by which the battery 10 is charged through the external charge process by $\Delta SOC$ that indicates the amount of increase in the SOC through the external charge process. That is, the ECU estimates an estimated value Ce of the full charge capacity of the battery 10 in accordance with the following formula (1).

$$Ce=(\Delta Ah/\Delta SOC)\times 100 [Ah] \quad (1)$$

$\Delta Ah$ is an integrated value (time integrated value) of the current IB since the start of external charge until the end of external charge. As $\Delta SOC$ becomes larger, the precision of the estimated value Ce becomes higher. On the other hand, when $\Delta SOC$ is so large that the battery 10 is charged to the fully charged state, degradation of the battery 10 tends to progress when the battery 10 is highly charged.

The capacity of the battery 10 has been increasing in recent years. When the capacity of the battery 10 is increased, it is occasionally preferred not to charge the battery 10 to the fully charged state, in order to suppress degradation of the battery 10. For example, occasionally, an upper limit SOC that is lower than the full charge SOC of the battery 10 is set (using the screen 700 in FIG. 2, by way of example), and the restricted charge process is executed. When the battery 10 is not charged to the fully charged state, $\Delta SOC$ due to charge becomes smaller in many cases than when the battery 10 is charged to the fully charged state. As a result, the precision of the full charge capacity (precision of the estimated value Ce) estimated using the above formula (1) may be lowered.

For example, when the upper limit SOC is set, $\Delta SOC$ in the above formula (1) is smaller than when the upper limit SOC is not set (when the charge end SOC is the full charge SOC) (on the assumption that the charge start SOC is equal). As a result, the estimated value Ce is significantly varied, which may lower the precision of the estimated value Ce. In particular, the precision of the estimated value Ce is remarkably lowered when the battery 10 is not fully charged over a long period. In this manner, the precision of the estimated value Ce may be lowered when the upper limit SOC is set.

The vehicle 1 according to the first embodiment is configured to address the above issues. This will be described in detail below.

Figure 4:
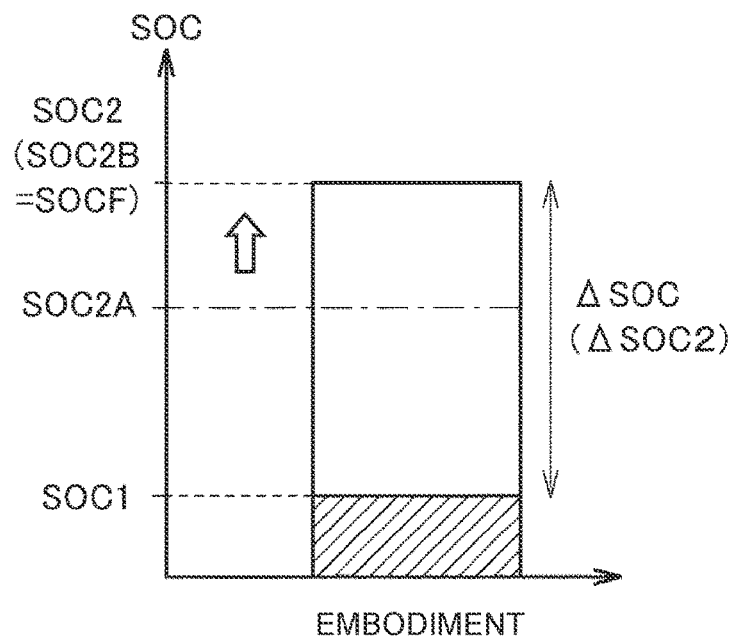
FIG. 4 is a diagram for illustrating a process of estimating the full charge capacity of the battery executed by an electronic control unit (ECU) according to the first embodiment.

FIG. 4 illustrates a process of estimating the full charge capacity of the battery 10 executed by the ECU 100 according to the first embodiment.

With reference to FIG. 4, the ECU 100 executes a process of estimating the full charge capacity (process of calculating the estimated value Ce) by dividing $\Delta Ah$ by $\Delta SOC$ in the above formula (1) as in the comparative example (FIG. 3).

On the other hand, the ECU 100 executes a first process or a second process when a predetermined condition that indicates a reduction in the precision in estimating the full charge capacity is met. The first process is a process in which the charge process is executed with the upper limit SOC set in the restricted charge process raised from that at the time when the above predetermined condition is not met (raised from SOC2A to SOC2B). While SOC2B is equal to SOCF in this example, SOC2B may be in the range between SOC2A and SOCF. The second process is a process in which the charge process is executed without executing the restricted charge process. The second process is a process in which the charge process is executed such that the charge end SOC is brought to the full charge SOC by canceling the set upper limit SOC (i.e. by setting the threshold SOC described earlier to the full charge SOC, rather than the upper limit SOC, even when the upper limit SOC is set). The second process may be a process in which, even when a user operation for setting the upper limit SOC is performing using the screen 700, the external charge process is executed by canceling the user operation (such that the battery 10 is charged to the fully charged state). When the above predetermined condition is not met, the ECU 100 executes the restricted charge process with the upper limit SOC at SOC2A.

With the above configuration, when the predetermined condition is not met, the restricted charge process is executed, and therefore the battery 10 is not charged to the fully charged state. As a result, degradation of the battery 10 is suppressed. When the predetermined condition is met, on the other hand, the charge process is executed with the upper limit SOC raised (first process), or the charge process is executed without executing the restricted charge process (i.e. without setting the upper limit SOC) (second process).

When the first process is executed, the upper limit SOC (SOC2 as the charge end SOC) is raised compared to the comparative example. Consequently, $\Delta SOC$ is increased from $\Delta SOC1$ to $\Delta SOC2$. That is, $\Delta SOC$ in the above formula (1) becomes larger than that in the comparative example. As a result, variations in the estimated value Ce are reduced compared to the comparative example. Hence, an error in the estimated value Ce is reduced, and therefore the precision of the estimated value Ce (precision in estimating the full charge capacity) is improved.

Alternatively, when the second process is executed, SOC (SOC2) at the end of external charge is the full charge SOC (SOCF). Consequently, $\Delta SOC$ is increased compared to the comparative example. As a result, the precision in estimating the full charge capacity can be improved. From the above, with the first embodiment, it is possible to suppress degradation of the battery 10 and improve the precision in estimating the full charge capacity at the same time.

The first process or the second process is particularly effective when the first process or the second process is executed by the ECU 100 when the upper limit SOC is set by the user (e.g. using the screen 700 in FIG. 2). Consequently, the first process or the second process is executed while enabling the user to set the upper limit SOC. As a result, it is possible to improve the precision in estimating the full charge capacity while improving the convenience for the user.

When the first process or the second process is executed, the ECU 100 may further execute an informing process of informing the user of that (i.e. that the first process or the second process is to be executed).

For example, when the user is informed of execution of the first process, the user is motivated to raise the upper limit SOC from the present set value (e.g. Y % in FIG. 2) (e.g. using the screen 700). Consequently, the upper limit SOC can be raised. Further, the convenience for the user can be improved.

Figure 5:
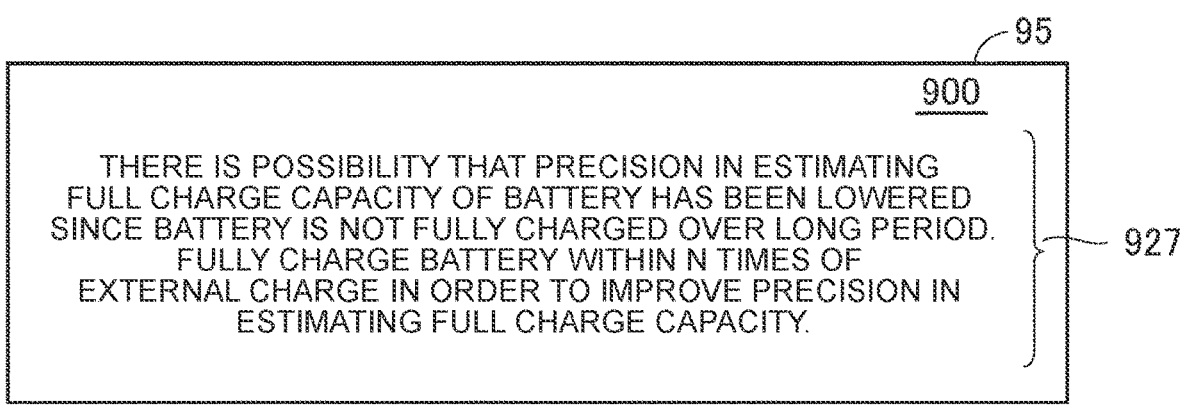
FIG. 5 is a diagram showing an example of a screen displayed on a display device of the user terminal in order to raise the upper limit SOC.

FIG. 5 illustrates an example of a screen displayed on the display device 95 of the user terminal 90 to raise the upper limit SOC.

With reference to FIG. 5, a screen 900 is displayed when the battery 10 is not fully charged over a long period (e.g. a predetermined period such as one month). The screen 900 includes a message 927. The message 927 prompts the user to fully charge the battery 10 within N times of external charge. In this example, the message 927 prompts the user to set the upper limit SOC to the full charge SOC using the screen 700 displayed on the user terminal 90.

When the battery 10 is not fully charged after the screen 900 is displayed, numeral "N" in the message 927 is decremented when the screen 900 is displayed the next time. Numeral "N" may be displayed more emphatically as N becomes smaller. For example, numeral "N" may be displayed in a first color (e.g. blue) when N is a predetermined threshold or more, and may be displayed in a second color (e.g. an attention calling color such as red) when N falls below the threshold. When N is displayed emphatically in this manner, the user can be effectively prompted to fully charge the battery 10 as early as possible.

The ECU 100 may be configured to inquire of the user whether the user agrees in order to raise the upper limit SOC. When an inquiry is made of the user in this manner, the convenience for the user can be further improved. This will be described in detail below.

Figure 6:
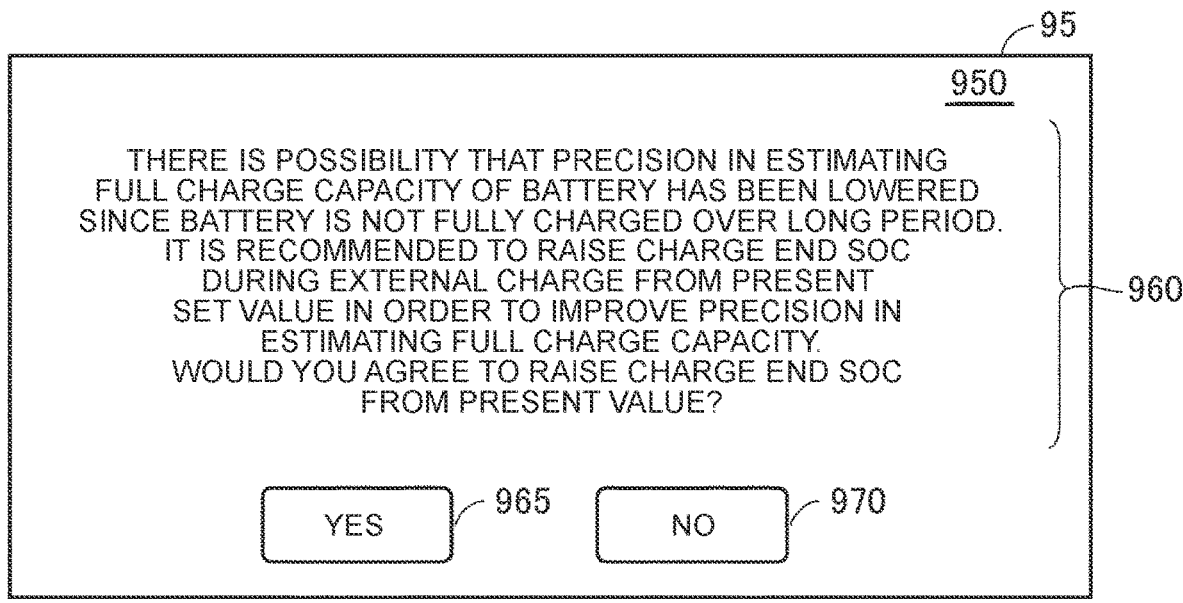
FIG. 6 is a diagram showing another example of the screen displayed on the display device of the user terminal in order to raise the upper limit SOC.

FIG. 6 illustrates another example of the screen displayed on the display device 95 of the user terminal 90 in order to raise the upper limit SOC.

With reference to FIG. 6, a screen 950 is displayed when the battery 10 is not fully charged over a long period (e.g. a predetermined period). The screen 950 includes a message 960 and buttons 965, 970. The message 960 inquires of the user whether it is possible to raise the upper limit SOC from the present set value.

The buttons 965, 970 are operated by the user. When the button 965 is operated, the ECU 100 raises the upper limit SOC from the present set value. When the button 970 is operated, the upper limit SOC is maintained at the present set value.

Figure 7:
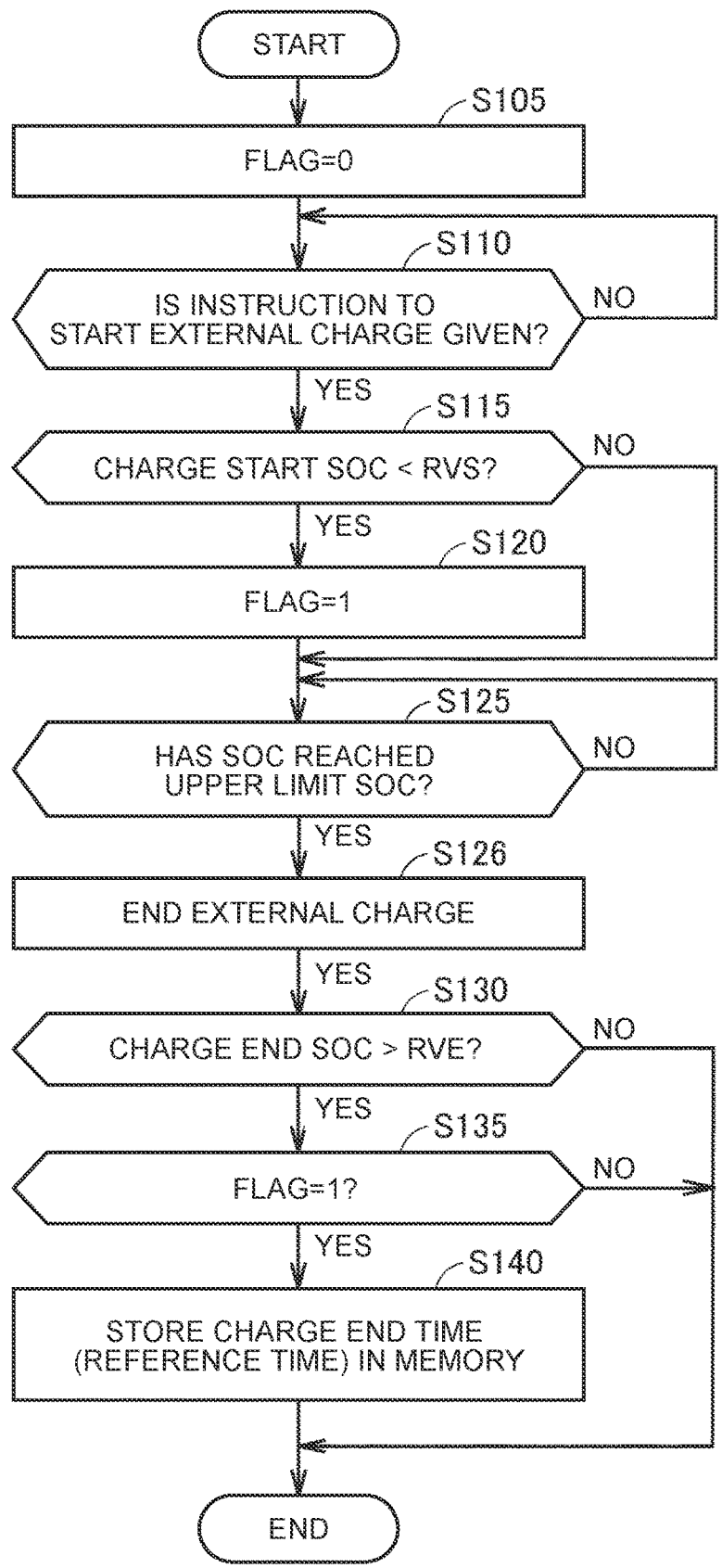
FIG. 7 is a flowchart showing an example of a process executed by the ECU in association with a restricted charge process.

FIG. 7 is a flowchart illustrating an example of a process executed by the ECU 100 in association with the restricted charge process. The process of the flowchart is started when the vehicle 1 is connected to the power facility 85 in the case where the upper limit SOC is set.

With reference to FIG. 7, the ECU 100 sets FLAG to 0 (step S105). FLAG is used for the ECU 100 to determine whether the battery 10 is sufficiently charged.

Then, the ECU 100 determines whether an instruction to start external charge of the vehicle 1 is given (step S110). The ECU 100 receives a signal that indicates whether an instruction to supply power from the power facility 85 to the vehicle 1 is given using the HMI device 85B from the power facility 85 through CAN communication, for example. Then, the ECU 100 executes the determination process in step S110 in accordance with the signal.

When an instruction to start external charge is not given (NO in step S110), the ECU 100 executes the above determination process until an instruction to start external charge is given. When an instruction to start external charge is given (YES in step S110), on the other hand, the process proceeds to step S115.

Then, the ECU 100 determines whether the charge start SOC is less than a reference value RVS (step S115). The reference value RVS corresponds to the second reference value described earlier, and is determined in advance, as appropriate, as a value (e.g. 30%) that is less than a reference value RVE to be described later. When the charge start SOC is not less than the reference value RVS (NO in step S115), the process proceeds to step S125. When the charge start SOC is less than the reference value RVS (YES in step S115), on the other hand, the ECU 100 sets FLAG to 1 (step S120), and the process proceeds to step S125.

Then, the ECU 100 determines whether the SOC has reached the upper limit SOC (step S125). When the SOC has not reached the upper limit SOC (NO in step S125), the ECU 100 executes the determination process until the SOC reaches the upper limit SOC. When the SOC has reached the upper limit SOC (YES in step S125), on the other hand, the ECU 100 ends external charge (step S126). In this case, the charge end SOC is the upper limit SOC. After that, the process proceeds to step S130.

Then, the ECU 100 switches the process in accordance with whether the charge end SOC is more than the reference value RVE (step S130). The reference value RVE corresponds to the first reference value described earlier, and is determined in advance, as appropriate, as a value (e.g. 80%) that is equal to or less than the full charge SOC.

When the charge end SOC is not more than the reference value RVE (NO in step S130), the process in FIG. 7 is ended.

When the charge end SOC is more than the reference value RVE (YES in step S130), on the other hand, the ECU 100 branches the process in accordance with the value of FLAG (step S135). When FLAG is 0 (NO in step S135), the process in FIG. 7 is ended.

When FLAG is 1 (YES in step S135), on the other hand, the external charge process has been started with the charge start SOC low enough to fall below the reference value RVS (YES in step S115), and the external charge process has been ended with the charge end SOC high enough to exceed the reference value RVE (YES in step S130). When the external charge process is started and ended in this manner, the external charge process is the reference charge process. When the reference charge process is executed, the ECU 100 determines that the battery 10 has been sufficiently charged, and stores the charge end time (reference time) in the memory 100B (step S140). After that, the process in FIG. 7 is ended.

Figure 8:
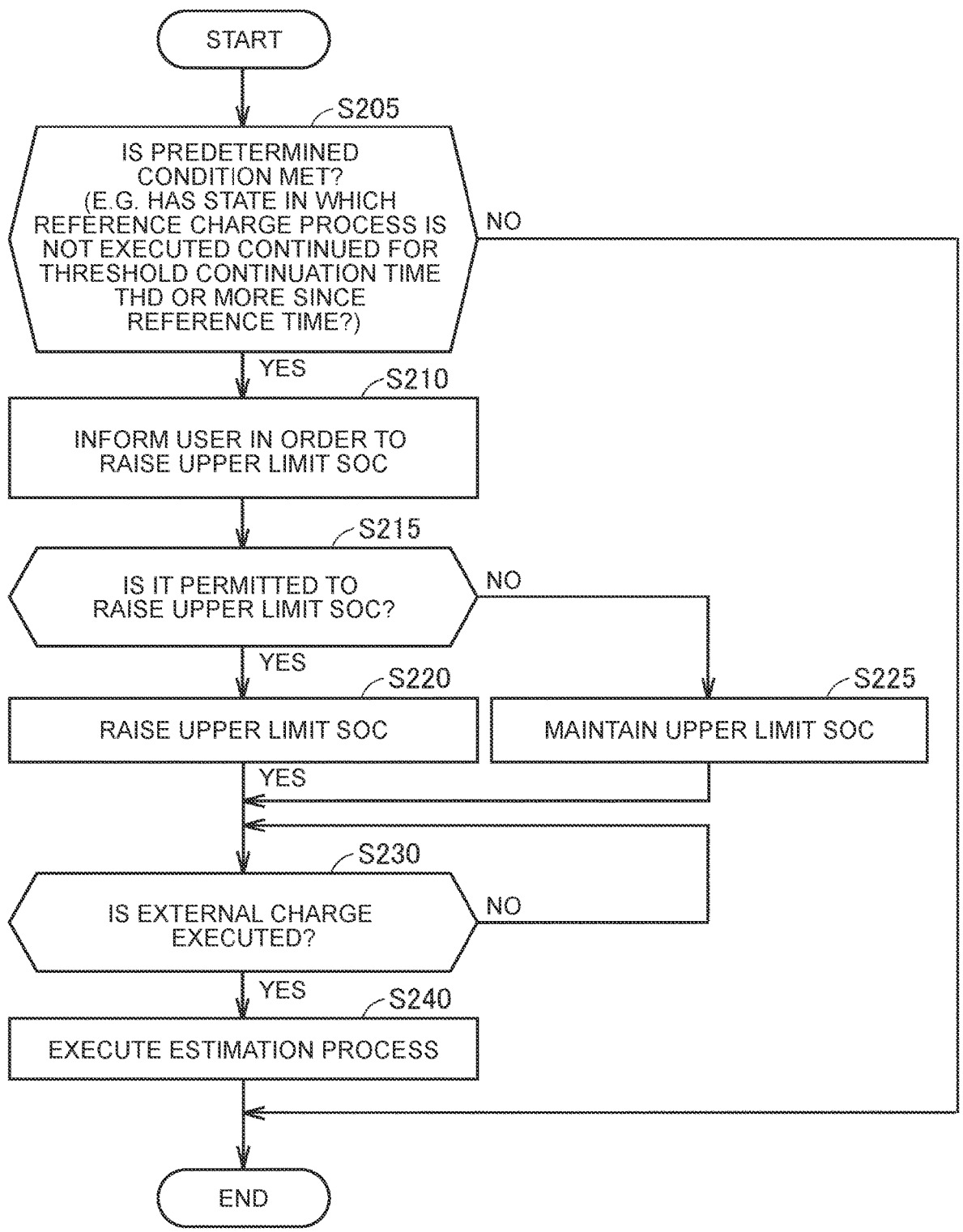
FIG. 8 is a flowchart showing an example of a process executed by the ECU in association with raising the upper limit SOC according to the first embodiment.

FIG. 8 is a flowchart illustrating an example of a process executed by the ECU 100 in association with raising the upper limit SOC according to the first embodiment. The process in the flowchart is executed at predetermined time intervals.

With reference to FIG. 8, the ECU 100 determines whether a predetermined condition that indicates a reduction in the precision in estimating the full charge capacity is met (step S205). In this example, the ECU 100 determines that the predetermined condition is met when a state in which the reference charge process is not executed has continued for a threshold continuation time THD or more since the reference time. Therefore, the determination process in step S205 corresponds to a process of determining whether a state in which the battery 10 is not sufficiently charged has continued for the threshold continuation time THD or more. The threshold continuation time THD is experimentally determined in advance, as appropriate, as a time for which the precision in estimating the full charge capacity of the battery 10 is not substantially varied when the time for which a state in which the reference charge process is not executed continues is less than the threshold continuation time THD.

When the state in which the reference charge process is not executed has not continued for the threshold continuation time THD or more since the reference time (NO in step S205), the ECU 100 ends the process in FIG. 8. The ECU 100 executes the restricted charge process when the external charge process is executed during a period until the above state continues for the threshold continuation time THD or more. When the above state has continued for the threshold continuation time THD or more (YES in step S205), on the other hand, the process proceeds to step S210.

Then, the ECU 100 executes a process of informing the user in order to raise the upper limit SOC from the present set value (e.g. to the full charge SOC) (step S210). In this example, the ECU 100 outputs a request to the user terminal 90 through the communication device 80 in order to display the screen 950 (FIG. 6) on the display device 95 of the user terminal 90.

Then, the ECU 100 determines whether it is permitted to raise the upper limit SOC (step S215).

When it is permitted to raise the upper limit SOC, e.g. when the button 965 on the screen 950 is operated within a predetermined time (YES in step S215), the ECU 100 raises the upper limit SOC set in the restricted charge process from the present set value (step S220). The set value before being raised is equal to the set value of the upper limit SOC at the time when the restricted charge process is executed in the case where the process takes the NO branch in step S205.

When it is not permitted to raise the upper limit SOC, on the other hand, e.g. when the button 970 on the screen 950 is operated within a predetermined time (NO in step S215), the ECU 100 maintains the upper limit SOC at the present set value (step S225).

After step S220 or S225, the ECU 100 switches the process in accordance with whether external charge is executed (step S230). When external charge is executed after step S220, the charge process is executed by the ECU 100 with the upper limit SOC raised compared to when the predetermined condition described earlier is not met (first process). When external charge is executed after step S225, the charge process is executed with the upper limit SOC maintained.

When external charge is not executed during a period after step S220 or S225 until step S230 (No in step S230), the ECU 100 executes the determination process in step S230 until external charge is executed. When external charge is executed (YES in step S230), on the other hand, the process proceeds to step S240.

Then, the ECU 100 executes an estimation process of estimating the full charge capacity of the battery 10 using the above formula (1) (step S240).

In the above description, when a predetermined condition is met (e.g. when YES is taken in step S205), the ECU 100 executes the external charge process with the upper limit SOC raised (first process), and informs the user of that (step S210). However, the ECU 100 may execute the external charge process without executing the restricted charge process (such that the battery 10 is fully charged) (second process), and inform the user of that. A process for the case where the second process is executed by the ECU 100, in place of the first process, in association with cancellation of the upper limit SOC will be described below.

In step S210, the ECU 100 informs the user in order to cancel the upper limit SOC. In the next step S215, the ECU 100 switches the process in accordance with whether it is permitted to cancel the upper limit SOC. When such permission is given, the ECU 100 cancels the upper limit SOC in step S220. When external charge is executed after the upper limit SOC is canceled, the charge process is executed by the ECU 100 without executing the restricted charge process. Then, the process of estimating the full charge capacity is executed (step S240).

Figure 9:
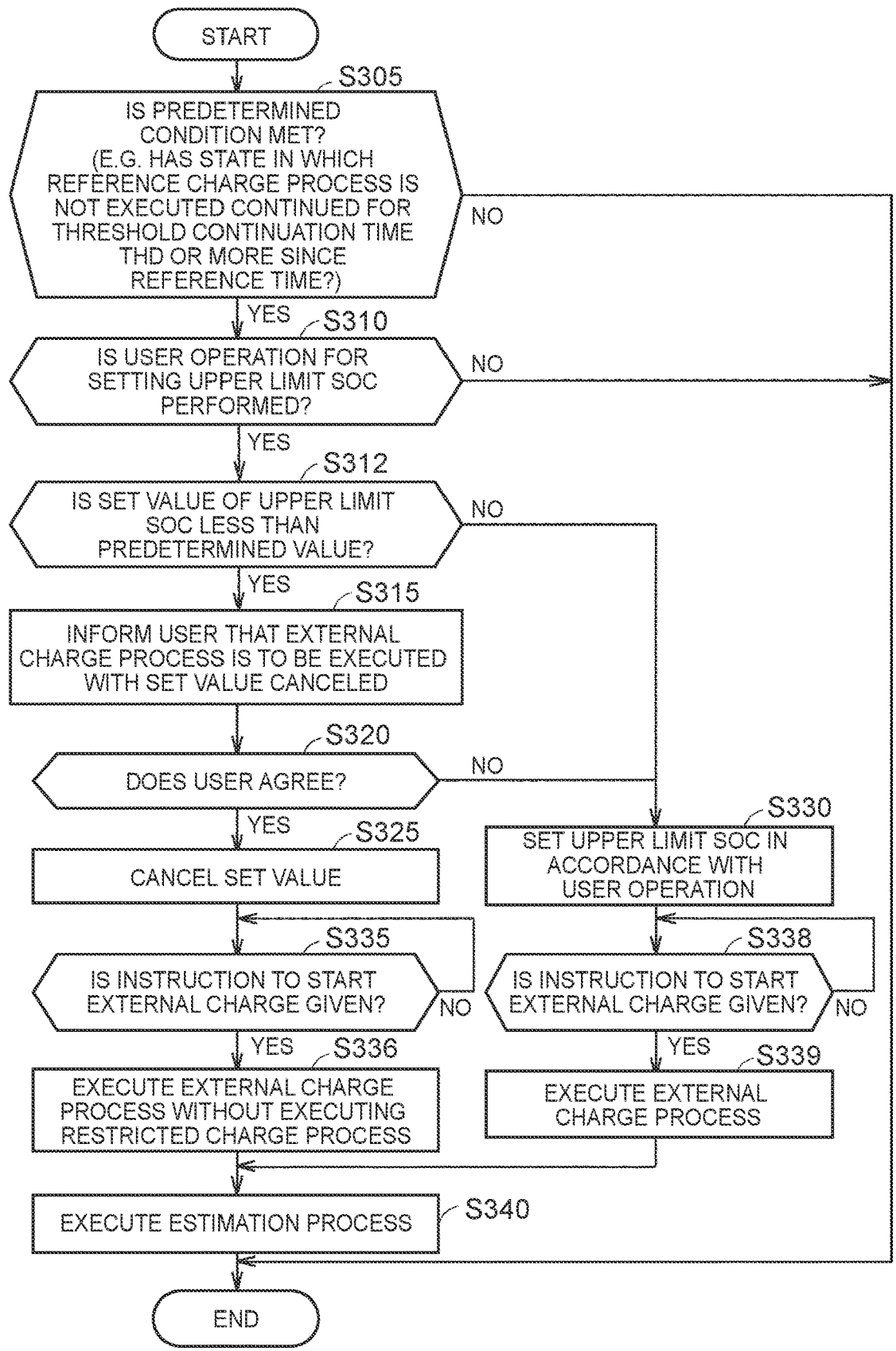
FIG. 9 is a flowchart showing another example of a process executed by the ECU in association with cancellation of the upper limit SOC.

FIG. 9 is a flowchart illustrating another example of a process executed by the ECU 100 in association with cancellation of the upper limit SOC. The process in the flowchart is executed at predetermined time intervals.

With reference to FIG. 9, the processes in steps S305, S340 are the same as the processes in steps S205, S240 (FIG. 8), respectively.

Then, the ECU 100 determines whether a user operation for setting the upper limit SOC is performed (step S310). When the user operation is not performed (NO in step S310), the ECU 100 ends the process in FIG. 9. When the above user operation is performed (YES in step S310), on the other hand, the set value of the upper limit SOC is output from the user terminal 90 to the vehicle 1, and the process proceeds to step S312.

Then, the ECU 100 determines whether the set value of the upper limit SOC output through the user operation is less than a predetermined value (step S312). This predetermined value is equal to the reference value RVE, for example. When the above set value is not less than the predetermined value (NO in step S312), there is a relatively high possibility that the battery 10 will be sufficiently charged. In this case, the process proceeds to step S330. When the set value of the upper limit SOC is lower than the predetermined value (YES in step S312), on the other hand, there is a relatively low possibility that the battery 10 is sufficiently charged. In this case, the process proceeds to step S315.

Then, the ECU 100 executes a process of informing the user that the external charge process is to be executed without executing the restricted charge process (in this example, that the external charge process is to be executed with the set value of the upper limit SOC output through the user operation canceled) (step S315). The ECU 100 outputs, to the user terminal 90 through the communication device 80, a request to display a screen for such informing on the display device 95 of the user terminal 90, for example.

Then, the ECU 100 determines whether the user agrees to execute the external charge process without executing the restricted charge process (step S320). The ECU 100 receives a signal that indicates whether the user agrees (i.e. a signal that indicates the result of a user operation performed using the HMI device 94 of the user terminal 90 in response to the informing in step S315) from the user terminal 90 through the communication device 80, and executes the above determination process in accordance with the signal, for example.

When the user agrees (YES in step S320), the ECU 100 cancels the set value of the upper limit SOC output from the user terminal 90 (step S325). Then, the ECU 100 determines whether an instruction to start external charge is given (step S335). When an instruction to start external charge is not given (NO in step S335), the ECU 100 executes the above determination process until an instruction to start external charge is given. When an instruction to start external charge is given (YES in step S335), on the other hand, the ECU 100 executes the external charge process without executing the restricted charge process (step S336).

When the user does not agree in step S320 (NO in step S320), the ECU 100 sets the upper limit SOC in accordance with the user operation (step S330). That is, the ECU 100 sets the set value output through the user operation as the upper limit SOC.

Then, the ECU 100 determines whether an instruction to start external charge is given (step S338). When an instruction to start external charge is not given (NO in step S338), the ECU 100 executes the above determination process until an instruction to start external charge is given. When an instruction to start external charge is given (YES in step S338), on the other hand, the ECU 100 executes the external charge process in accordance with the upper limit SOC set through the user operation (step S339).

After step S336 or step S339, the ECU 100 executes the process of estimating the full charge capacity (step S340), and ends the process in FIG. 9.

The ECU 100 may raise the predetermined value in step S312 (e.g. stepwise) as the time (continuation time) for which the state in which the reference charge process is not executed has continued since the reference time is longer. This renders the predetermined value so high as to be substantially equal to the full charge SOC when the continuation time is sufficiently long. Consequently, the set value of the upper limit SOC output through the user operation may be canceled unless the set value is high enough to be close to the full charge SOC. As a result, only an upper limit SOC that is sufficiently high may be set, and therefore the upper limit SOC (charge end SOC) can be inevitably sufficiently high. Thus, the precision in estimating the full charge capacity can be enhanced.

With the estimation system 2 according to the present embodiment, as described above, it is possible to suppress degradation of the battery 10 and improve the precision in estimating the full charge capacity at the same time.

First Modification of First Embodiment

In a first modification, the ECU 100 further executes a reduction informing process for informing the user, before execution of the first process, that the charge start SOC for executing the first process is to be reduced. The ECU 100 outputs, to the user terminal 90 through the communication device 80, a request to display a screen that informs the user that external charge is to be started with the charge start SOC less than the reference value RVS, in addition to the screen 950 (FIG. 6), on the display device 95 of the user terminal 90, for example.

With such a configuration, the user is motivated to reduce the charge start SOC. That is, the user is prompted to use the vehicle 1 until the SOC becomes sufficiently low. The user may start external charge of the vehicle 1 with the charge start SOC reduced from a normal charge start SOC in response to the above informing. The normal charge start SOC is an SOC at the time when the user often desires to start external charge of the vehicle 1 in daily life. When external charge is started as described above, the charge start SOC is reduced, and therefore $\Delta$SOC can be further increased.

Figure 10:
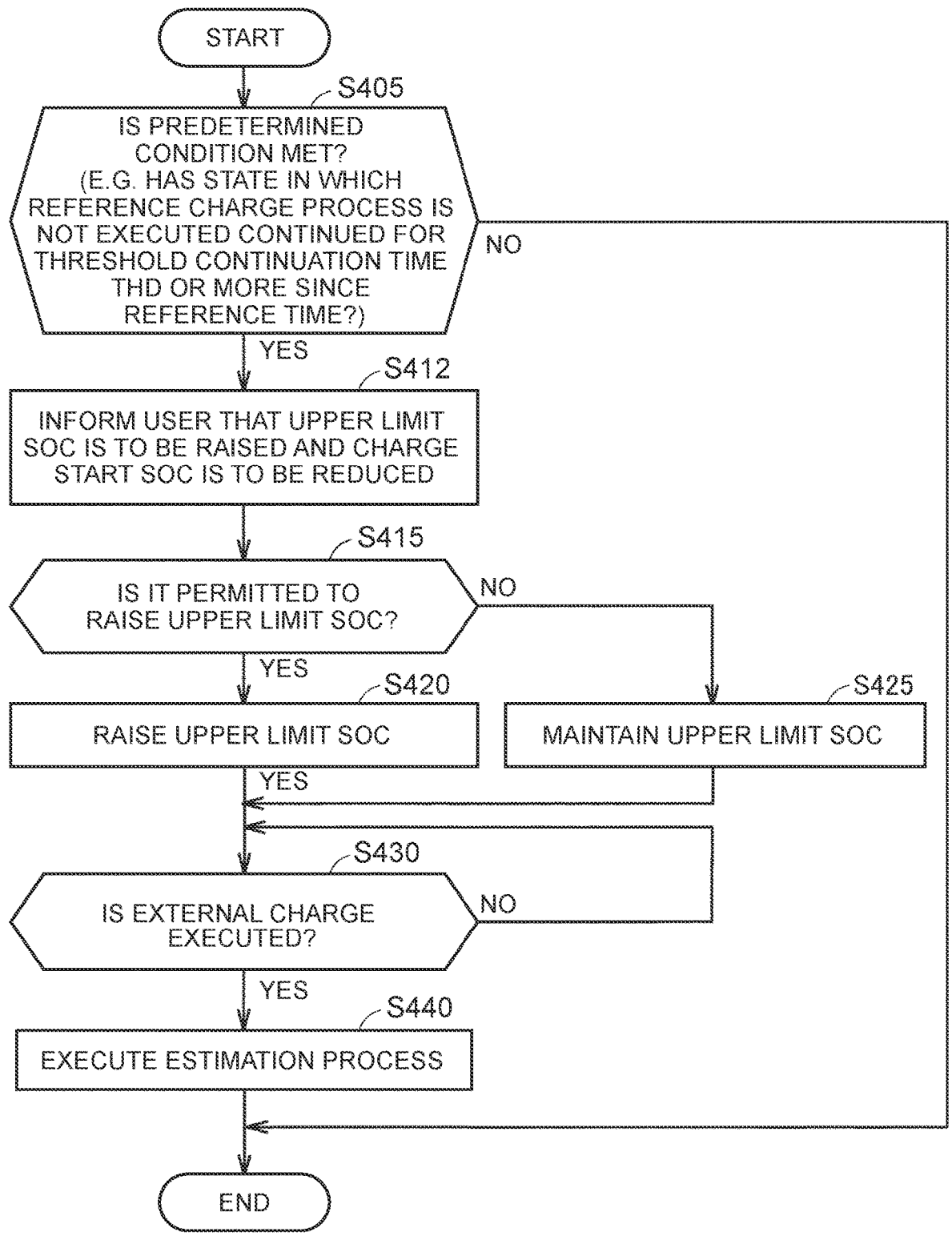
FIG. 10 is a flowchart showing an example of a process executed by the ECU according to a first modification.

FIG. 10 is a flowchart illustrating an example of a process executed by the ECU 100 according to the first modification. The process in the flowchart is executed at predetermined time intervals.

With reference to FIG. 10, this flowchart is different from the flowchart in FIG. 8 in that the process in step S412 is executed in place of step S210 (FIG. 8). The processes in steps S405, S415 to S440 are the same as the processes in steps S205, S215 to S240, respectively.

When a predetermined condition that indicates a reduction in the precision in estimating the full charge capacity is met (YES in step S405), the ECU 100 executes a process of informing the user that the upper limit SOC is to be raised and the charge start SOC is to be reduced before execution of the first process (step S412). This informing process includes the reduction informing process described earlier. After that, the process proceeds to step S415. Then, when permission is given in step S415 (YES in step S415), the upper limit SOC is raised, and thereafter the external charge process is executed (first process).

When the vehicle 1 is used by the user such that the charge start SOC at the start of the external charge process is reduced compared to the normal charge start SOC, $\Delta$SOC can be increased compared to when the charge start SOC is not reduced. As a result, with the first modification, the process of estimating the full charge capacity can be executed more appropriately.

Second Modification of First Embodiment

The threshold continuation time THD may be determined so as to be shorter as the time elapsed since the start of use of the battery 10 is shorter. The start of use of the battery 10 is the time when a brand-new battery 10 is incorporated into the vehicle 1 in the factory or the time when the user registers use of the vehicle 1 using the HMI device 94, for example.

Figure 11:
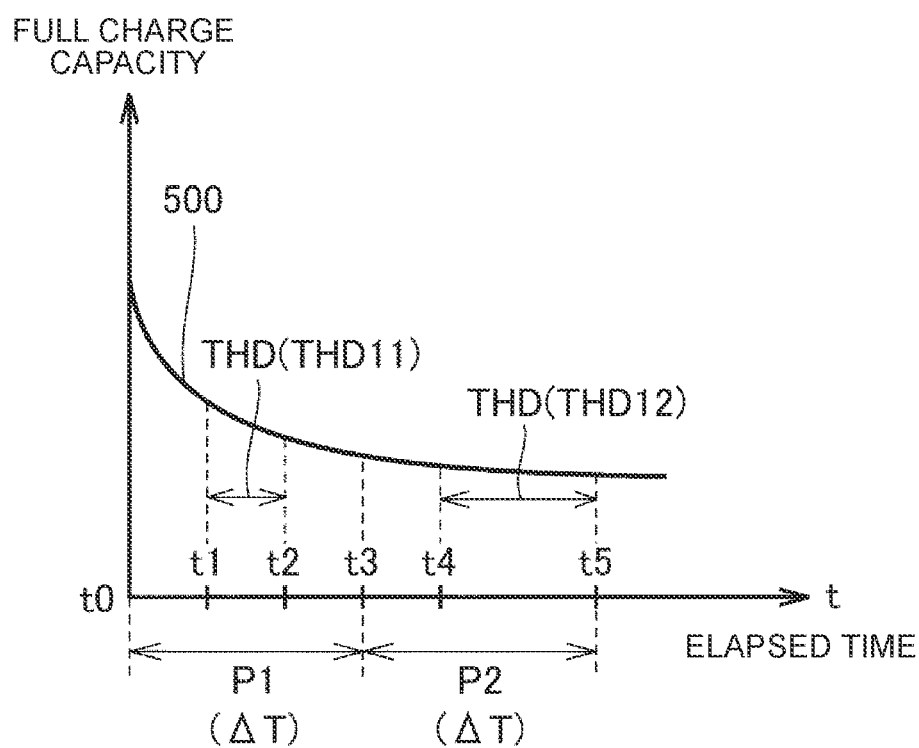
FIG. 11 is a diagram showing the relationship between the full charge capacity of the battery and the time elapsed since the start of use of the battery.

FIG. 11 illustrates the relationship between the full charge capacity of the battery 10 and the time elapsed since the start of use of the battery 10.

With reference to FIG. 11, time t0 is the start of use of the battery 10. A period P1 is a period from t0 to t3. A period P2 is a period from t3 to t5. The length of each of the periods P1, P2 is $\Delta$T.

A curve 500 indicates the transition of the full charge capacity of the battery 10. The curve 500 indicates that the full charge capacity is more easily lowered as an elapsed time t since time t0 is shorter. For example, the full charge capacity is more easily varied (lowered) (the rate of variation in the full charge capacity is higher) in the period P1 than in the period P2. Therefore, the process of estimating the full charge capacity with higher precision is desired during the period P1 compared to the other periods (e.g. the period P2).

In this example, the ECU 100 determines the threshold continuation time THD for each period such that the threshold continuation time THD (THD11) for the period P1 is shorter than the threshold continuation time THD (THD12) for the period P2 (THD11<THD12).

For example, during the period P1, the ECU 100 executes the first process or the second process when the state in which the reference charge process is not executed has continued for the threshold continuation time THD (THD11) since time t1 as the reference time (at time t2 or later).

During the period P2, on the other hand, the ECU 100 executes the first process or the second process when the state in which the reference charge process is not executed has continued for the threshold continuation time THD (THD12) since time t4 as the reference time (at time t5 or later).

When the threshold continuation time THD is determined as described above, the threshold continuation time THD is shorter as the estimation precision is more easily varied. This allows the first process or the second process to be executed more easily. Consequently, the frequency of the first process or the second process is enhanced. Thus, the frequency at which the process of estimating the full charge capacity is appropriately executed can be enhanced.

Third Modification of First Embodiment

The ECU 100 may determine that a predetermined condition that indicates a reduction in the precision in estimating the full charge capacity is met when the state in which the upper limit SOC is set by the user continues for a threshold time or more. The threshold time is determined in advance, as appropriate, as a time for which the precision in estimating the full charge capacity of the battery 10 is not substantially varied when the time for which the above state continues is less than the threshold time.

As the time for which the above state continues becomes longer, the time for which the battery 10 is not fully charged becomes longer. Therefore, there is a higher possibility that the estimation process is executed with low ΔSOC. As a result, the precision in estimating the full charge capacity may be lowered. When the predetermined condition is determined as described above, the restricted charge process can be executed until the state in which the upper limit SOC is set by the user continues for the threshold time or more. On the other hand, the first process or the second process is executed when this state continues for the threshold time or more. A case where the first process, of the first process and the second process, is executed will be mainly described below.

Figure 12:
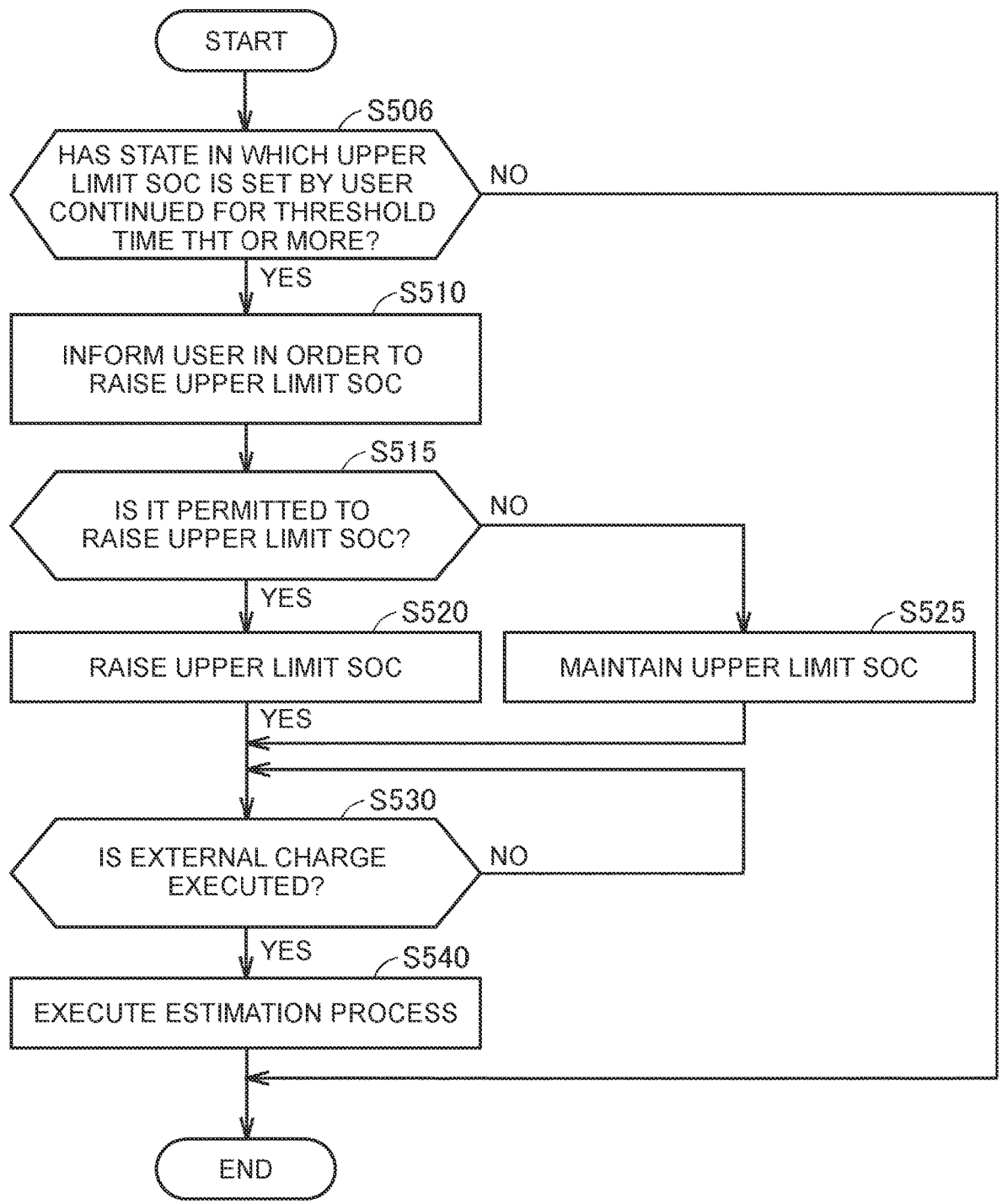
FIG. 12 is a flowchart showing an example of a process executed by the ECU according to a third modification.

FIG. 12 is a flowchart illustrating an example of a process executed by the ECU 100 according to a third modification. The process in the flowchart is executed at predetermined time intervals.

With reference to FIG. 12, this flowchart is different from the flowchart in FIG. 8 in that the process in step S506 is executed in place of step S205 (FIG. 8). The processes in steps S510 to S540 are the same as the processes in steps S210 to S240, respectively.

The ECU 100 determines whether the state in which the upper limit SOC is set by the user has continued for a threshold time THT or more (step S506). When this state has not continued for the threshold time THT or more (NO in step S506), the ECU 100 ends the process in FIG. 12. When the above state has continued for the threshold time THT or more (YES in step S506), on the other hand, the process proceeds to step S510. After that, the charge process is executed with the upper limit SOC raised in step S520 (first process). The ECU 100 may execute the external charge process without executing the restricted charge process (second process) when the above state continues for the threshold time THT or more.

With the third modification, as described above, the first process or the second process can be executed at an appropriate timing.

Fourth Modification of First Embodiment

The ECU 100 may determine that a predetermined condition that indicates a reduction in the precision in estimating the full charge capacity is met when the restricted charge process is executed a threshold number of times or more consecutively in the case where the external charge process is executed. The threshold number of times is determined in advance, as appropriate, as a value for suppressing a reduction in the precision in estimating the full charge capacity.

As the number of times of consecutive execution of the restricted charge process becomes larger, the time for which the battery 10 is not fully charged becomes longer. Therefore, there is a higher possibility that the estimation process is executed with low ΔSOC. As a result, the precision in estimating the full charge capacity may be lowered. When the predetermined condition is determined as described above, the first process or the second process is executed when the restricted charge process is executed the threshold number of times or more consecutively. A case where the first process, of the first process and the second process, is executed will be mainly described below.

Figure 13:
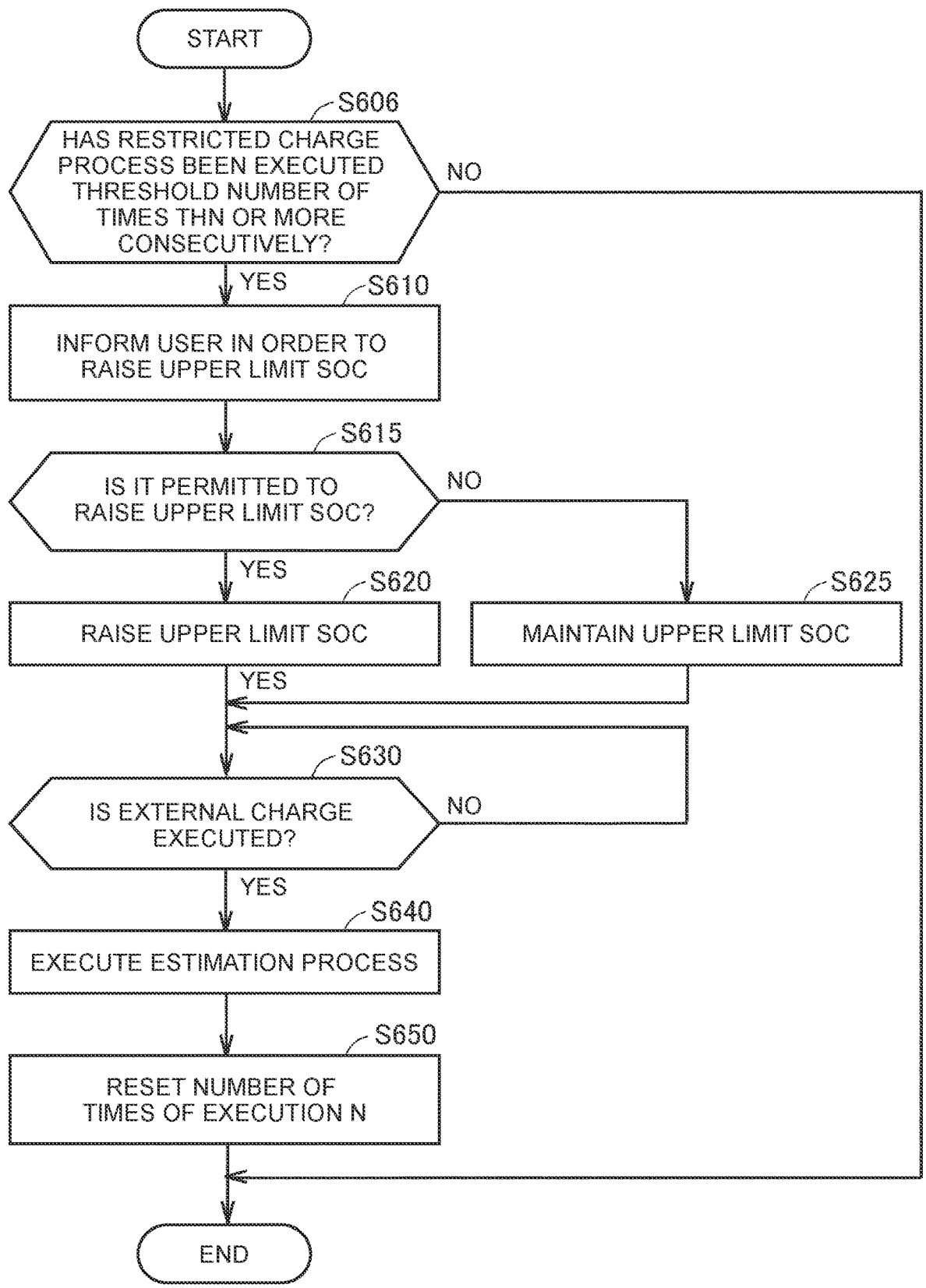
FIG. 13 is a flowchart showing an example of a process executed by the ECU according to a fourth modification.

FIG. 13 is a flowchart illustrating an example of a process executed by the ECU 100 according to a fourth modification. The process in the flowchart is executed at predetermined time intervals.

With reference to FIG. 13, this flowchart is different from the flowchart in FIG. 8 in that the process in step S606 is executed in place of step S205 (FIG. 8) and that the process in step S650 is further executed. The processes in steps S610 to S640 are the same as the processes in steps S210 to S240, respectively.

The ECU 100 determines whether the restricted charge process has been executed a threshold number of times THN or more consecutively (step S606). The number of times of consecutive execution (number of times of execution N) of the restricted charge process is stored in the memory 100B. The ECU 100 increments the number of times of execution N by one when the restricted charge process is executed, and executes the above determination process by determining whether the number of times of execution N after the increment is the threshold number of times THN or more.

When the restricted charge process has not been executed the threshold number of times THN or more consecutively (NO in step S606), the ECU 100 executes the process in FIG. 13. When the restricted charge process has been executed the threshold number of times THN or more consecutively (YES in step S606), on the other hand, the process proceeds to step S610.

After the processes in steps S610 to S640 are executed, the ECU 100 resets the number of times of execution N to zero (step S650), and the process in FIG. 13 is ended.

With the fourth modification, as described above, the first process or the second process can be executed at an appropriate timing.

Second Embodiment

In a second embodiment, the precision in estimating the full charge capacity of the battery 10 is determined (calculated) in accordance with the charge start SOC and the charge end SOC, and the first or second process is executed when the estimation precision is equal to or less than a threshold. In this case, the ECU 100 may determine that a predetermined condition that indicates a reduction in the precision in estimating the full charge capacity is met when the estimation precision is equal to or less than threshold precision.

Figures 14, 15:
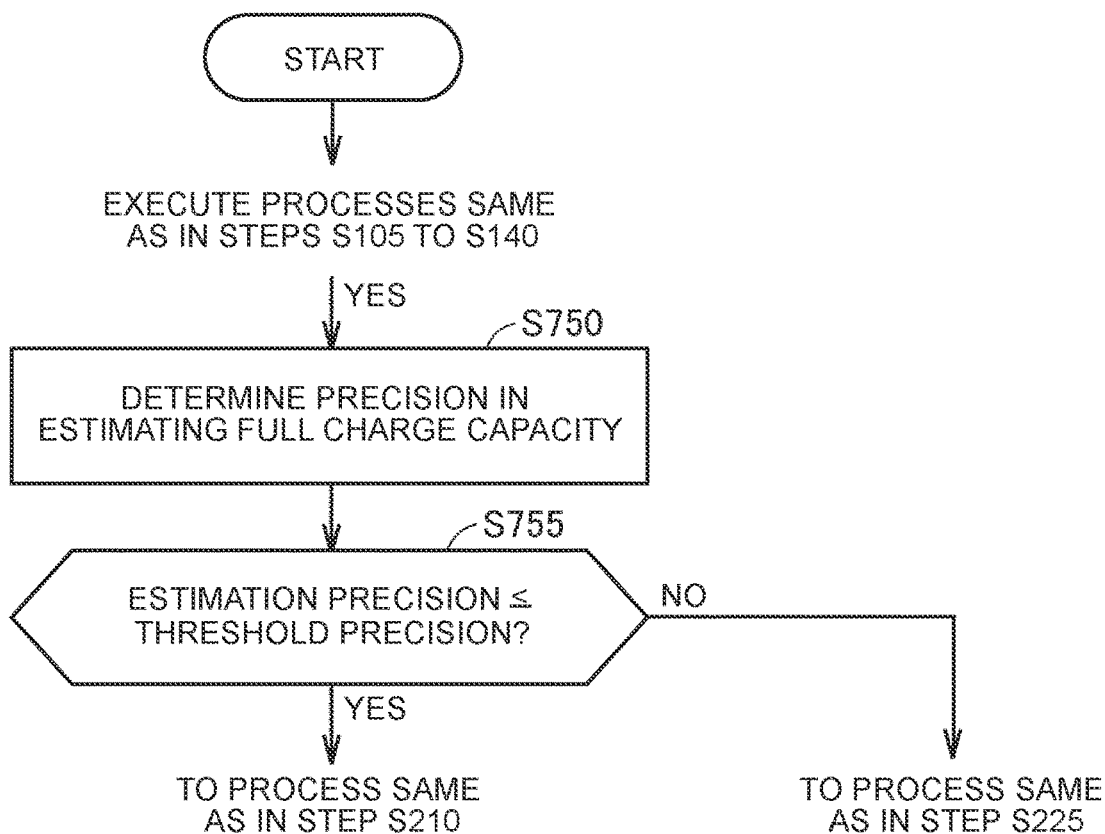
FIG. 14 is a diagram for illustrating how the ECU determines the precision in estimating the full charge capacity of the battery.
FIG. 15 is a flowchart showing an example of a process executed by the ECU in association with estimating the full charge capacity according to a second embodiment.

FIG. 14 illustrates how the ECU 100 determines the precision in estimating the full charge capacity of the battery 10.

With reference to FIG. 14, a table 800 is stored in the memory 100B. The table 800 indicates the relationship between the combination of the charge start SOC (SOC1) and the charge end SOC (SOC2>SOC1) and the precision in estimating the full charge capacity.

When external charge is ended, the ECU 100 determines the precision in estimating the full charge capacity in accordance with the charge start SOC and the charge end SOC using the table 800. For example, when the charge start SOC is SOCA and the charge end SOC is SOCB (SOCA<SOCB), the ECU 100 determines PAB as the estimation precision.

The estimation precision is basically higher as the difference (ΔSOC=SOC2−SOC1) between the charge start SOC and the charge end SOC is larger. For example, PAD>PAC>PAB is met. The estimation precision corresponding to the combination of the charge start SOC and the charge end SOC is experimentally determined in advance, as appropriate, based on the characteristics of the battery 10.

The ECU 100 may calculate the precision in estimating the full charge capacity in accordance with the estimation precision determined using the table 800 and a history of the precision in estimating the full charge capacity, rather than the estimation precision itself. The history is stored in the memory 100B. When the precision in estimating the full charge capacity is calculated in this manner, the history of the precision in estimating the full charge capacity can be reflected in the process of calculating the precision in estimating the full charge capacity.

The ECU 100 calculates the precision in estimating the full charge capacity using the following formula (2), and executes the first process or the second process when the estimation precision is equal to or less than the threshold precision, for example.

$$PRn = PR(n-1) \times (1-RR) + Pn \times RR \qquad (2)$$

In the above formula (2), PRn represents the precision in estimating the full charge capacity calculated when n-th external charge is executed since the start of use of the battery 10 (in this example, when the current external charge is executed). PRn is related to PR(n−1) to be described below, and therefore reflects the history of the precision in estimating the full charge capacity.

PR(n−1) represents the precision in estimating the full charge capacity calculated when (n−1)-th external charge is executed (when the preceding external charge is executed).

Pn is the precision in estimating the full charge capacity determined using the table 800 itself when the current external charge is executed. That is, Pn is not related to the history of the precision in estimating the full charge capacity.

RR is the reflection rate that indicates how much each of Pn related to the current external charge and PR(n−1) related to the preceding external charge is reflected in PRn (0≤ RR≤1). As RR becomes closer to 1, Pn related to the current external charge is reflected in PRn to a greater degree. For example, when RR is 1, the second term on the right side of the above formula (2) is equal to Pn. RR is determined in advance, as appropriate, through a preliminary evaluation test.

FIG. 15 is a flowchart illustrating an example of a process executed by the ECU 100 in association with estimating the full charge capacity according to the second embodiment. The flowchart is started when the vehicle 1 is connected to the power facility 85 in the case where the upper limit SOC is set. FIGS. 7 to 9 will be referenced as appropriate in the following description.

With reference to FIG. 15, the ECU 100 executes the same processes as in steps S105 to S140 (FIG. 7).

Then, the ECU 100 determines the precision in estimating the full charge capacity using the table 800 in accordance with the charge start SOC and the charge end SOC (step S750). The ECU 100 may calculate the precision in estimating the full charge capacity further using the above formula (2).

Then, the ECU 100 determines whether the estimation precision is equal to or less than the threshold precision (step S755). When the estimation precision is not equal to or less than the threshold precision (NO in step S755), the ECU 100 maintains the upper limit SOC at the present set value (the same process as in step S225). After that, the ECU 100 executes the same processes as in steps S230 to S240 (FIG. 8).

When the estimation precision is equal to or less than the threshold precision (YES in step S755), on the other hand, the ECU 100 executes a process of informing the user in order to raise the upper limit SOC from the present set value (the same process as in step S210). After that, the ECU 100 executes the same processes as in steps S215 to S240. The ECU 100 executes the first process (steps S220, S235), for example.

In the above, when the estimation precision is equal to or less than the threshold precision, the ECU 100 executes the same processes as in steps S215 to S240. However, the ECU 100 may execute the processes in steps S310 to S340 (FIG. 9). In these processes, when the process takes the YES branch in step S335, the ECU 100 executes the process in step S336 (second process).

With the second embodiment, as described above, the first process or the second process can be executed at an appropriate timing.

OTHER MODIFICATIONS

The ECU 100 may output, to the user terminal 90 through the communication device 80, a request to display the estimation precision calculated using the table 800 and the estimation precision (estimated value Ce) of the full charge capacity on the display device 95 of the user terminal 90. In order to guarantee the quality of a power storage device to be mounted on an electrified vehicle such as the vehicle 1, it is occasionally required by laws and regulations to present the full charge capacity of the power storage device to a user with high precision. Such laws and regulations can be met when a request is output as described above.

The user may be informed by sound using the speaker of the HMI device 94. Alternatively, the user may be informed through screen display using the display device 72 of the HMI device 70 of the vehicle 1, or by sound using the speaker of the HMI device 70.

The power facility 85 may be a direct current power facility. That is, the power facility 85 may further include a power conversion device that converts alternating current power supplied from the power source 85A into direct current power. In this case, the charge device 50 of the vehicle 1 is not essential, and the above direct current power is directly supplied to the battery 10 not via the charge device 50. In this manner, even when the power facility 85 is a direct current power facility, the first process and the second process by the ECU 100 are effective from the viewpoint of improving the precision in estimating the full charge capacity.

The power facility 85 may include a power transmission device that transmits power to the vehicle 1 in a contactless manner. In this case, the vehicle 1 may further include a power reception device that receives power from the power transmission device in a contactless manner. The ECU 100 may be configured to execute a contactless charge process in which the battery 10 is charged using power received by the power reception device as the external charge process.

The vehicle 1 may be a different electrified vehicle such as a plug-in hybrid electric vehicle (PHEV) that further includes an engine as long as the ECU 100 can execute the external charge process.

The screen 700 (FIG. 2) may be displayed on the HMI device 70 of the vehicle 1. That is, the user can set the upper limit SOC using the HMI device 70. In this case, the set value of the upper limit SOC is output from the HMI device 70 to the ECU 100.

The embodiments disclosed herein should be construed as illustrative in all respects and not limiting. The scope of the present disclosure is set forth by the claims, and is intended to include all modifications that fall within the meaning and scope equivalent to those of the claims.

What is claimed is:

1. An estimation system comprising:
a power storage device;
a charge device configured to charge the power storage device; and
one or more processors configured to:
execute a charge process of controlling the charge device so as to charge the power storage device, the charge process including a restricted charge process in which the one or more processors control the charge device so as to charge the power storage device such that a state of charge of the power storage device does not become more than an upper limit state of charge set to be lower than a full state of charge of the power storage device; and
execute an estimation process of estimating a full charge capacity of the power storage device, the estimation process including a process of estimating the full charge capacity by dividing an amount of charge by which the power storage device is charged through the charge process by ΔSOC that indicates an amount of increase in the state of charge through the charge process,
wherein the one or more processors are configured to:
execute the restricted charge process when a predetermined condition is not met; and
execute, when the predetermined condition is met, the restricted charge process with the upper limit state of charge of the power storage device set to a second upper limit state of charge that is more than a first upper limit state of charge that is the upper limit state of charge at a time when the condition is not met,
wherein the one or more processors are configured to determine that the predetermined condition is met when the upper limit state of charge is set by a user, and
wherein the one or more processors are configured to determine that the predetermined condition is met when a state in which the upper limit state of charge is set by the user has continued for a predetermined threshold time or more.

2. The estimation system according to claim 1, wherein the one or more processors are configured to execute, when the predetermined condition is met, the restricted charge process with the upper limit state of charge of the power storage device set to the second upper limit state of charge, and further execute the estimation process through the restricted charge process.

3. The estimation system according to claim 1, wherein the second upper limit state of charge is the full state of charge of the power storage device.

4. The estimation system according to claim 1, wherein the one or more processors are configured to determine that the predetermined condition is met when the restricted charge process is executed a threshold number of times or more consecutively.

5. The estimation system according to claim 1, wherein the one or more processors are configured to further execute an informing process when the restricted charge process is executed with the predetermined condition determined to be met and the upper limit state of charge of the power storage device set to the second upper limit state of charge, the informing process informing that the restricted charge process is executed with the upper limit state of charge set to the second upper limit state of charge.

6. The estimation system according to claim 5, wherein the one or more processors are configured to execute the restricted charge process with the upper limit state of charge of the power storage device set to the second upper limit state of charge when setting of the upper limit state of charge to the second upper limit state of charge is permitted by a user in the informing process.

7. The estimation system according to claim 5, wherein the one or more processors are configured to further execute a reduction informing process before executing the restricted charge process with the upper limit state of charge of the power storage device set to the second upper limit state of charge when the predetermined condition is determined to be met, the reduction informing process being a process of informing a user that the state of charge at a start of charge of the power storage device is to be rendered less than a predetermined state of charge.

8. The estimation system according to claim 1, wherein:
the charge process includes a reference charge process in which the one or more processors control the charge device so as to charge the power storage device with the state of charge at an end of charge of the power storage device more than a predetermined first reference value and with the state of charge at a start of charge of the power storage device less than a predetermined second reference value that is less than the first reference value; and
the one or more processors are configured to determine that the predetermined condition is met when a state in which the reference charge process is not executed has continued for a predetermined threshold continuation time or more.

9. The estimation system according to claim 8, wherein the predetermined threshold continuation time is shorter as a time elapsed since a start of use of the power storage device is shorter.

10. The estimation system according to claim 1, wherein:
the one or more processors are configured to determine that the predetermined condition is met when an estimation precision is equal to or less than a predetermined threshold precision; and
the estimation precision is determined in accordance with the state of charge at a start of charge of the power storage device and the state of charge at an end of charge of the power storage device.

11. The estimation system according to claim 1, wherein:
the power storage device is mounted on a vehicle;
the charge process is an external charge process in which the one or more processors control the charge device so as to charge the power storage device using power from a power facility provided outside the vehicle; and
the amount of charge is an amount of power by which the power storage device is charged from the power facility since a start of the external charge process until an end of the external charge process.

12. A vehicle comprising the estimation system according to claim 1.

13. An estimation method comprising:
executing a charge process of controlling a charge device so as to charge a power storage device, the charge process including a restricted charge process of controlling the charge device so as to charge the power storage device such that a state of charge of the power storage device does not become more than an upper limit state of charge set to be lower than a full state of charge of the power storage device;

executing an estimation process of estimating a full charge capacity of the power storage device, the estimation process including a process of estimating the full charge capacity by dividing an amount of charge by which the power storage device is charged through the charge process by $\Delta SOC$ that indicates an amount of increase in the state of charge through the charge process;

determining whether a predetermined condition is met;

executing the restricted charge process when the predetermined condition is determined to be not met; and executing, when the predetermined condition is determined to be met, the restricted charge process with the upper limit state of charge of the power storage device set to a second upper limit state of charge that is more than a first upper limit state of charge that is the upper limit state of charge at a time when the condition is not met, wherein the predetermined condition is determined to be met when the upper limit state of charge is set by a user, and wherein the predetermined condition is determined to be met when a state in which the upper limit state of charge is set by the user has continued for a predetermined threshold time or more.

14. The estimation method according to claim 13, further comprising when the predetermined condition is met, executing the restricted charge process with the upper limit state of charge of the power storage device set to the second upper limit state of charge, and further executing the estimation process through the restricted charge process.

15. The estimation method according to claim 13, wherein the second upper limit state of charge is the full state of charge of the power storage device.

16. The estimation method according to claim 13, wherein the predetermined condition is determined to be met when the restricted charge process is executed a threshold number of times or more consecutively.

17. The estimation method according to claim 13, further comprising
further executing an informing process when the restricted charge process is executed with the predetermined condition determined to be met and the upper limit state of charge of the power storage device set to the second upper limit state of charge, the informing process informing that the restricted charge process is executed with the upper limit state of charge set to the second upper limit state of charge.

* * * * *